United States Patent
Chen et al.

(10) Patent No.: US 8,785,283 B2
(45) Date of Patent: Jul. 22, 2014

(54) METHOD FOR FORMING SEMICONDUCTOR STRUCTURE HAVING METAL CONNECTION

(71) Applicant: United Microelectronics Corp., Hsin-Chu (TW)

(72) Inventors: Chieh-Te Chen, Kaohsiung (TW); Feng-Yi Chang, Tainan (TW); Chih-Sen Huang, Tainan (TW); Ching-Wen Hung, Tainan (TW); Ching-Pin Hsu, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/705,183

(22) Filed: Dec. 5, 2012

(65) Prior Publication Data
US 2014/0154852 A1 Jun. 5, 2014

(51) Int. Cl.
*H01L 21/336* (2006.01)
*H01L 29/66* (2006.01)

(52) U.S. Cl.
CPC .................................. *H01L 29/66477* (2013.01)
USPC ........................... 438/287; 438/620; 438/672

(58) Field of Classification Search
CPC .................... H01L 21/768; H01L 21/76805
See application file for complete search history.

(56) References Cited

U.S. PATENT DOCUMENTS

| 6,075,293 | A  | * | 6/2000  | Li et al. ........................ 257/763 |
| 6,100,137 | A  | * | 8/2000  | Chen et al. .................... 438/253 |
| 6,211,059 | B1 | * | 4/2001  | Inoue et al. ................... 438/620 |
| 6,365,453 | B1 | * | 4/2002  | Deboer et al. ................. 438/253 |
| 6,518,671 | B1 | * | 2/2003  | Yang et al. .................... 257/758 |
| 6,680,538 | B2 | * | 1/2004  | Kim et al. ..................... 257/751 |
| 7,064,044 | B2 | * | 6/2006  | Chen et al. .................... 438/401 |
| 7,186,569 | B2 | * | 3/2007  | Rinerson et al. ................. 438/3 |
| 7,592,262 | B2 | * | 9/2009  | Huang et al. .................. 438/717 |
| 7,763,925 | B2 | * | 7/2010  | Hong ............................. 257/307 |
| 7,786,520 | B2 | * | 8/2010  | Lee et al. ...................... 257/296 |
| 7,803,639 | B2 | * | 9/2010  | Assefa et al. ..................... 438/3 |
| 7,862,982 | B2 | * | 1/2011  | Burns et al. ................ 430/270.1 |
| 8,288,271 | B2 | * | 10/2012 | Yusuff et al. .................. 438/636 |
| 8,389,359 | B2 | * | 3/2013  | Teo et al. ...................... 438/259 |
| 8,436,404 | B2 | * | 5/2013  | Bohr et al. .................... 257/288 |
| 2002/0105088 | A1 | * | 8/2002  | Yang et al. .................... 257/774 |
| 2002/0173079 | A1 | * | 11/2002 | Kaltalioglu ................... 438/118 |
| 2009/0166868 | A1 | * | 7/2009  | Lee et al. ...................... 257/751 |
| 2011/0057241 | A1 | * | 3/2011  | Irani et al. .................... 257/314 |
| 2012/0256299 | A1 | * | 10/2012 | Hu et al. ....................... 257/618 |
| 2013/0049219 | A1 | * | 2/2013  | Tsai et al. ..................... 257/774 |
| 2013/0093048 | A1 | * | 4/2013  | Chang et al. .................. 257/532 |
| 2013/0161707 | A1 | * | 6/2013  | Huang et al. .................. 257/288 |

\* cited by examiner

*Primary Examiner* — Reema Patel
*Assistant Examiner* — Syed Gheyas
(74) *Attorney, Agent, or Firm* — Winston Hsu; Scott Margo

(57) ABSTRACT

The present invention provides a method for forming a semiconductor structure having a metal connect. A substrate is provided, and a transistor and a first ILD layer are formed thereon. A first contact plug is formed in the first ILD layer to electrically connect the source/drain region. A second ILD layer and a third ILD layer are formed on the first ILD layer. A first opening above the gate and a second opening above the first contact plug are formed, wherein a depth of the first contact plug is deeper than that of the second opening. Next, the first opening and the second opening are deepened. Lastly, a metal layer is filled into the first opening and the second opening to respectively form a first metal connect and a second metal connect.

15 Claims, 5 Drawing Sheets

METHOD FOR FORMING SEMICONDUCTOR STRUCTURE HAVING METAL CONNECTION

BACKGROUND OF THE INVENTION

1. Field of the Invention

The present invention relates a method for forming a semiconductor structure having at least a metal connection, and more particularly, to a method for forming a semiconductor structure having a gate and a first contact plug, wherein a top surface of the first contact plug is higher than a top surface of the gate.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional poly-silicon gate to be the control electrode that are suitable for use as the high-k gate dielectric layer.

In addition, in conventional arts, after forming the transistor with a metal gate, a wiring system is formed thereabove to electrically connect the metal gate and the source/drain, thereby providing a signal input/output pathway for the transistor. However, the wiring system connecting the source/drain in conventional arts usually includes a plurality of contacts plugs, resulting in a problem of high resistance and low electrical performance. Furthermore, as the miniaturization of the devices, a problem of electrical short between the metal gate and the contact plug connecting the source/drain is easy to occur and the quality of the device is decreased as well. Consequently, there is still a need for a novel semiconductor structure having at least a contact plug to resolve the above-mentioned problem.

SUMMARY OF THE INVENTION

The present invention therefore provides a method for forming a semiconductor structure having at least a metal connection, in which the method is able to improve the overall electrical performance of the devices.

According to one embodiment of the present invention, a method for forming a semiconductor structure having at least a metal connection is provided. A substrate is provided, and a transistor and a first ILD layer are formed thereon. A first contact plug is formed in the first ILD layer to electrically connect the source/drain region. A second ILD layer and a third ILD layer are formed on the first ILD layer. A first opening above the gate and a second opening above the first contact plug are formed, wherein a depth of the first contact plug is deeper than that of the second opening. Next, the first opening and the second opening are deepened. Lastly, a metal layer is filled into the first opening and the second opening to respectively form a first metal connection and a second metal connection.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
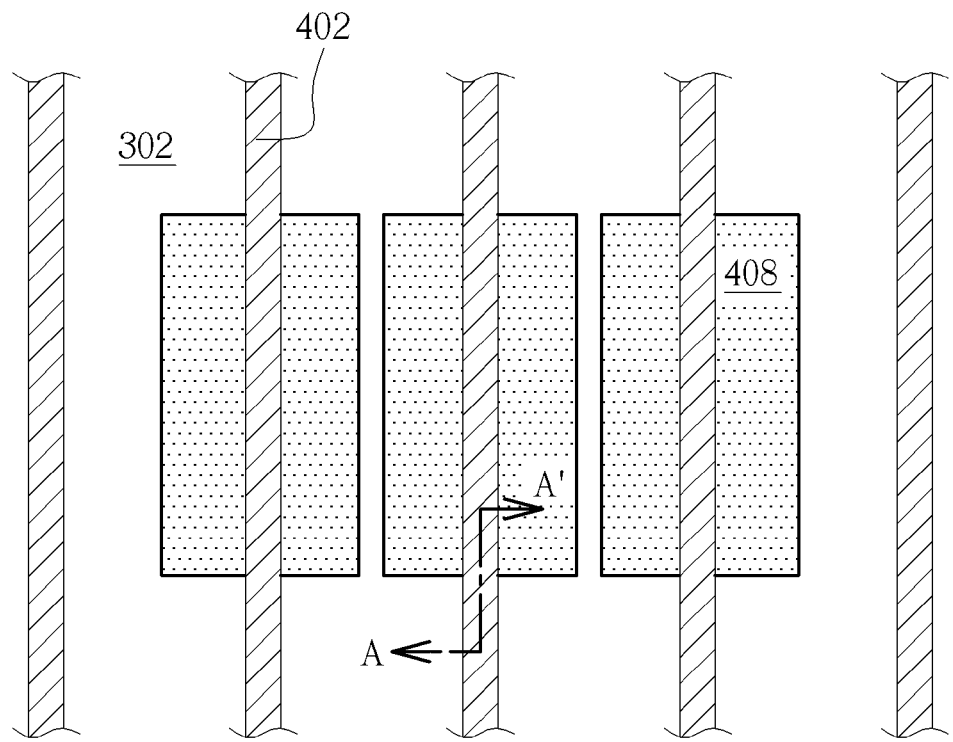
FIG. 1 to FIG. 10 show schematic diagrams of the method of forming the semiconductor structure having at least a metal connection according to one embodiment of the present invention.
Figure 2:
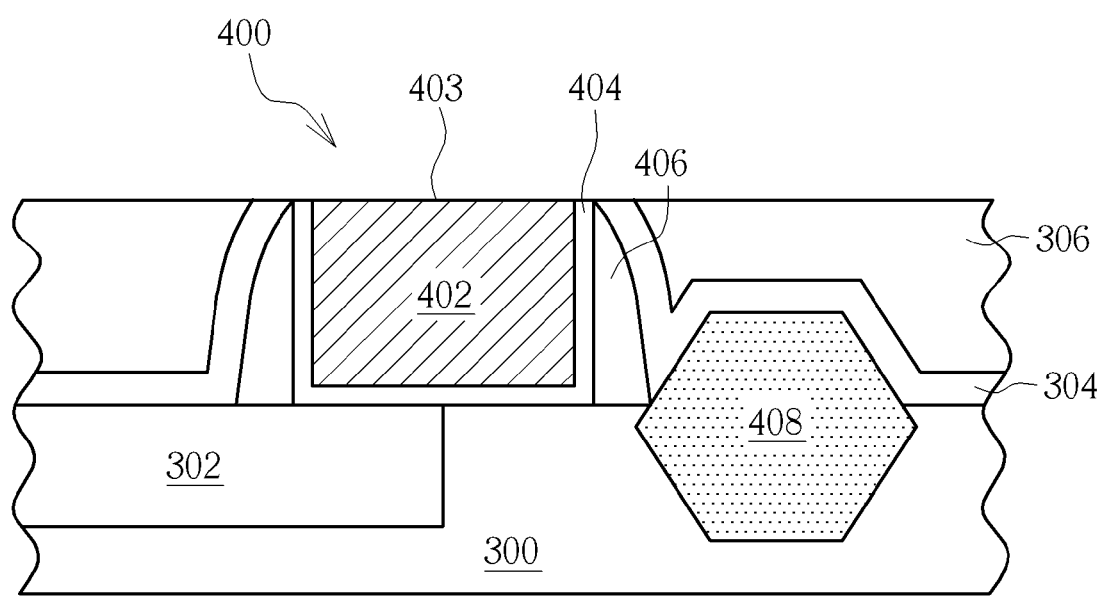
Figure 7:
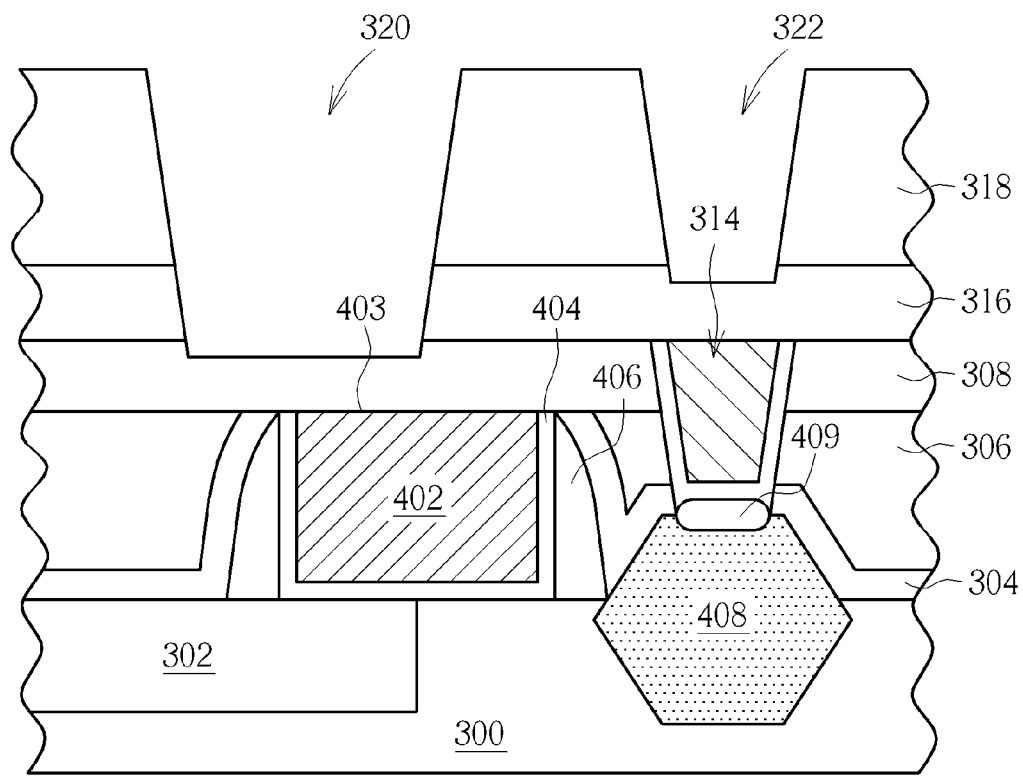
Figure 8:
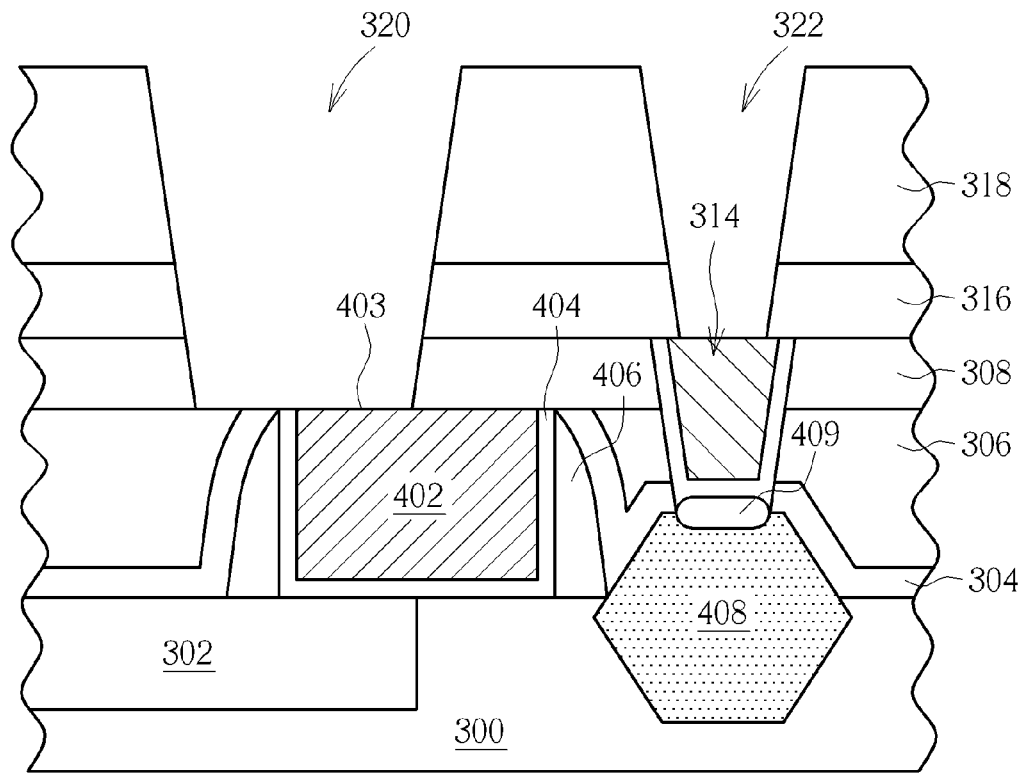
Figure 9:
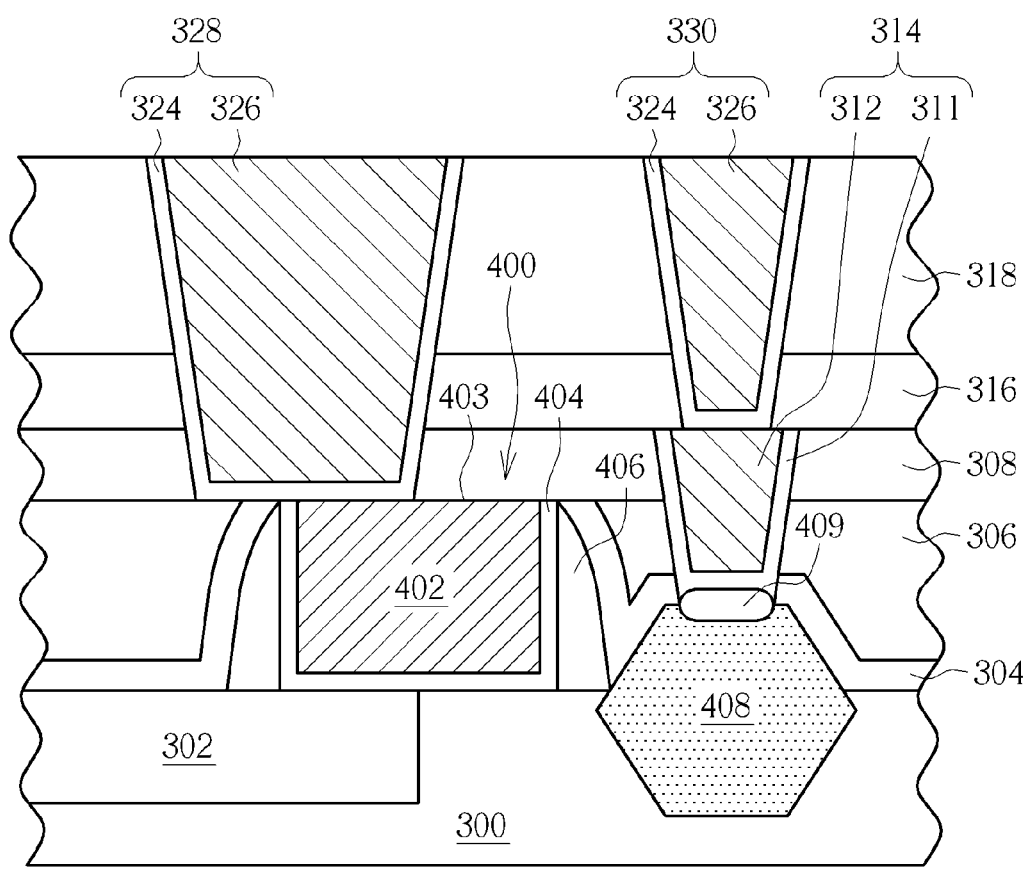
Figure 10:
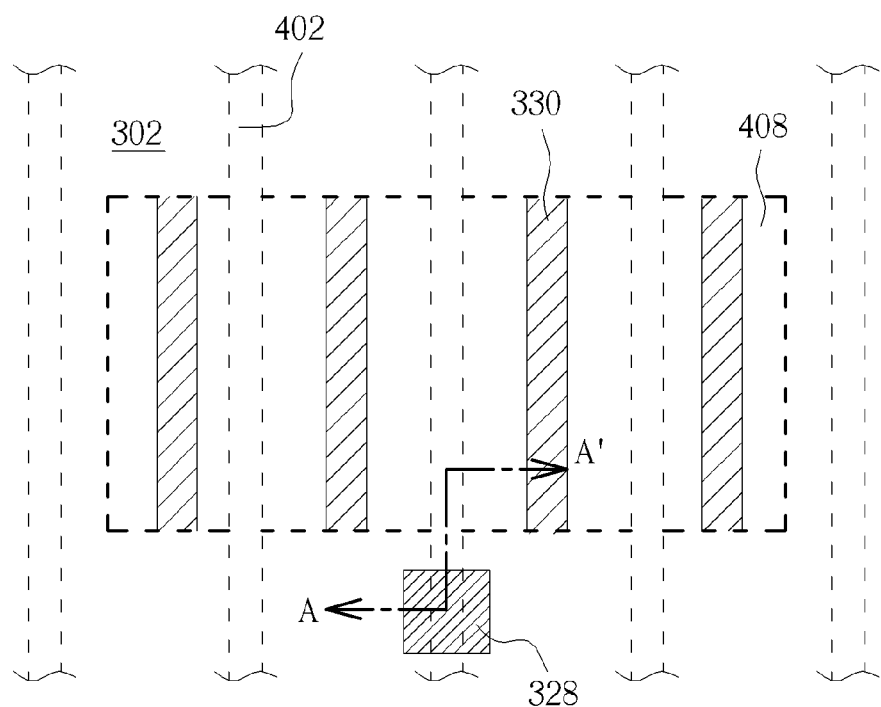

Please refer to FIG. 1 to FIG. 10, which show schematic diagrams of the method of forming a semiconductor structure having at least a contact plug in the present invention, wherein FIG. 2 is a cross sectional view taken along line AA' of FIG. 1, and FIG. 9 is a cross sectional view taken along line AA' of FIG. 10. As shown in FIG. 1 and FIG. 2, a substrate 300 is provided, and a plurality of shallow trench isolations (STI) 302 are formed on the substrate 300. The substrate 300 can be a silicon substrate, an epitaxial silicon substrate, a silicon germanium substrate, a silicon carbide substrate or a silicon-on-insulator (SOI) substrate, but is not limited thereto. A transistor 400 is then formed on the substrate 300. The transistor 400 includes a gate 402 and a source/drain region 408. In one preferred embodiment of the present invention, the transistor 400 is formed by a "gate last" semiconductor manufacturing process and includes a metal gate 402. For example, a dummy gate (not shown) is formed on the substrate 300, and then a spacer 406, a source/drain region 408, a contact etch stop layer (CESL) 304 and a dielectric layer 306 are sequentially formed on the substrate 300. Next, the dummy gate is removed to form a trench (not shown), which is subsequently filled with a gate dielectric layer 404 and a gate 402. A planarization process is further performed to make a top surface 403 of the gate 402 level with the dielectric layer 306. In one embodiment, as shown in FIG. 2, the gate dielectric layer 404 has a "U-shaped" cross section and the material thereof include $SiO_2$ or high-k materials. The gate 402 can contain one or a plurality of metal layers, for example, a work function metal layer, a barrier layer and a low-resistance metal layer.

Figure 3:
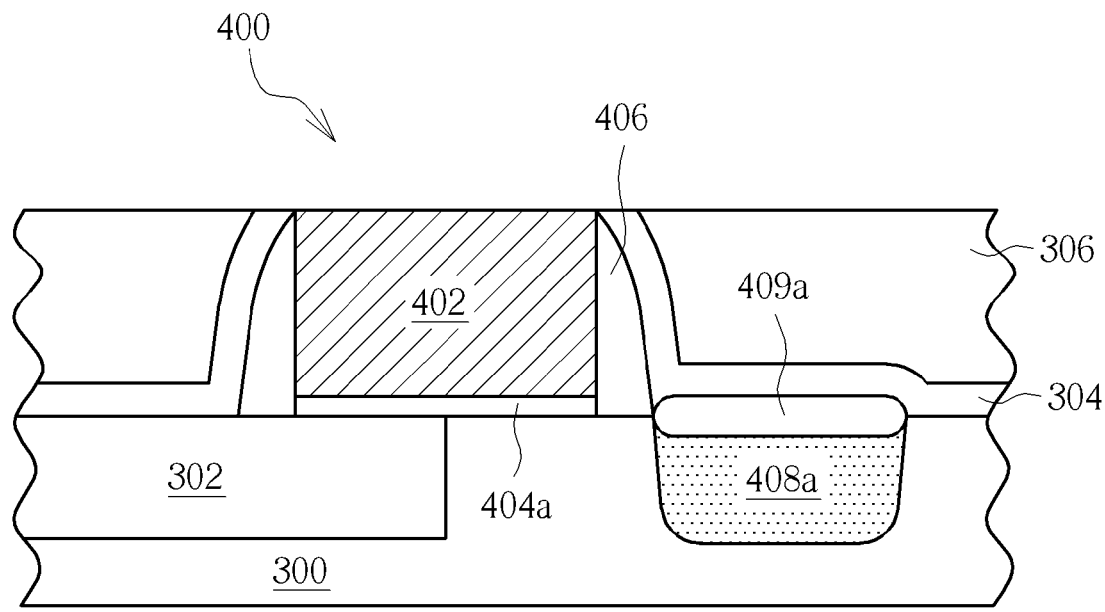

It is worth noting that each component of the transistor 400 can have different embodiments according to different designs of the devices. For example, as shown in FIG. 2, the source/drain region 408 can contain a SiGe layer for PMOS or a SiC layer for NMOS, which is formed by a selective epitaxial growth (SEG) process. In one preferred embodiment, the epitaxial layer of the source/drain region 408 extends upwardly from the substrate 300 and downwardly into the substrate 300. In one embodiment, the epitaxial layer has a hexagonal (also called "sigma Σ") or an octagonal cross section, in which a flat bottom surface of the epitaxial layer is disposed in the substrate 300. In another embodiment, the epitaxial layer extends under the spacer 406 to further enhance the stress effect. In another embodiment, the CESL 304 can also provide a stress so as to form a selective strain scheme (SSS). In another embodiment, as shown in FIG. 3, the gate dielectric layer 404a is formed by a "high-k first" process (that is, the gate dielectric layer is formed before the dummy gate) and therefore has a "-" shape in its cross section, which is different form the "U" shape of the embodiment in FIG. 2, which is formed by a "high-k last" process (that is, the gate dielectric layer is formed after removing the dummy gate). In another embodiment, a silicide layer 409a can be formed on the source/drain region 408a. The above embodiments are only shown for example. The transistor 400 in the present invention can have a variety of embodiments, which are not described for the sake of simplicity. The following description is based on the embodiment shown in FIG. 2.

Figure 4:
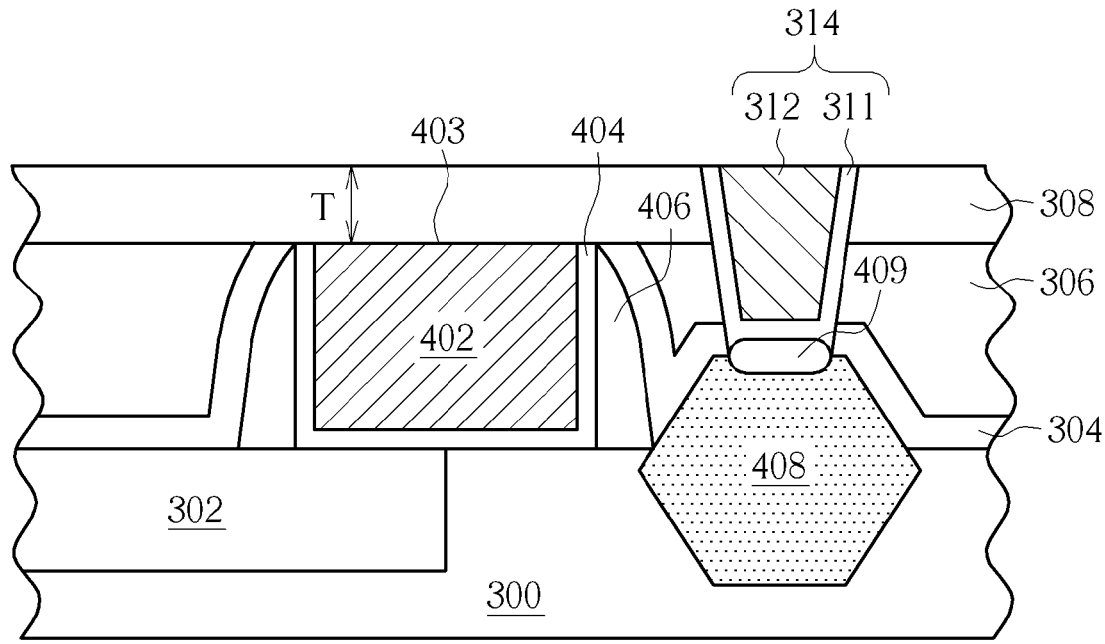

As shown in FIG. 4, a first ILD layer 308 is formed on the substrate 300, and a first contact plug 314 is then formed in the dielectric layer 306 and first ILD layer 308 to electrically connect the source/drain region 408. The step of forming the first contact plug 314 includes forming an opening (not shown) in the first ILD layer 308 and the dielectric layer 306, and filling a first barrier layer 311 and a first metal layer 312 sequentially into the opening, wherein the first barrier layer 311 is formed conformally along the surface of the opening, and the first metal layer 312 completely fills the opening. Thereafter, a planarization step, such as a chemical mechanical polish (CMP) process or an etching back process or their combination, can be performed to remove the first metal layer 312 and the first barrier layer 311 outside the opening, and further remove the first ILD layer 308 to a predetermined thickness T. As shown in FIG. 4, after the planarization process, the top surface 403 of the gate 402 is not exposed and is still covered by the first ILD layer 308 having the predetermined thickness T. In one embodiment, the predetermined thickness T is greater than 100 angstroms, preferably between 100 to 500 angstroms, and most preferably between 100 to 200 angstroms.

In one embodiment, before filling the opening with the first barrier layer 311 and the first metal layer 312, a salicidation process can be performed to forming a silicide layer 409 such as a NiSi layer on the source/drain region 408 that is exposed by the opening. In another embodiment of the present invention as shown in FIG. 3, since the silicide layer 409a has been formed on the source/drain region 408, the step of forming the silicide layer can be omitted.

In one embodiment, the first ILD layer includes any kinds of dielectric materials, such as $SiO_2$, tetraethyl orthosilicate (TEOS) or plasma enhanced etraethyl orthosilicate (PE-TEOS), but is not limited thereto. The first barrier layer 311 can include Ti, TiN or TaN or a plurality of metal layers such as Ti/TiO, but is not limited thereto. The first metal layer 312 can include a variety of low-resistance metal materials, such as aluminum (Al), titanium (Ti), tantalum (Ta), tungsten (W), niobium (Nb), molybdenum (Mo), copper (Cu) or the like, preferably tungsten or copper, and most preferably tungsten, which can form suitable Ohmic contact between the first metal layer 312 and the silicide layer 409 or the below source/drain region 408. In one embodiment, the first contact plug 314 can have appropriate stress. The tensile or compressive stress from the first metal layer 312 of the first contact plug 314 can cause stress on the source/drain region 408, thereby improving the electrical performance of the transistor 400. In one embodiment, when the transistor 400 is a NMOS, the first metal layer 312 can have a tensile stress.

Figure 5:
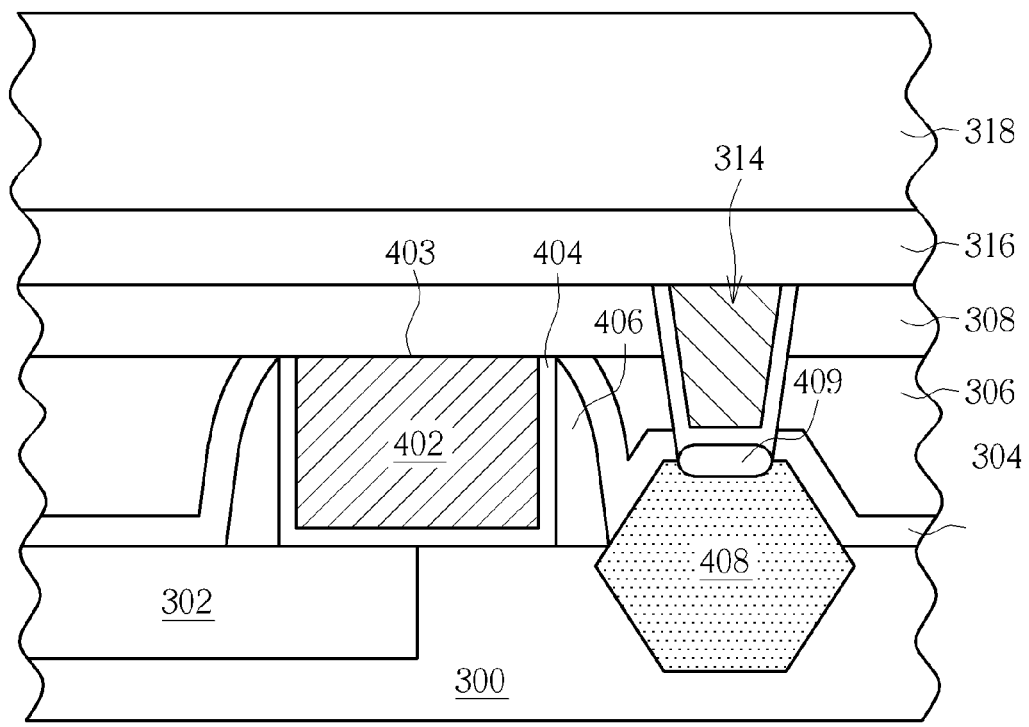

As shown in FIG. 5, a second ILD layer 316 and a third ILD layer 318 are formed on the substrate 300. In one embodiment, the second ILD layer 316 has an etching selectivity with respect to the first ILD layer 308 and the third ILD layer 318. That is, by using the same etchant, the etching rate for the second ILD layer 316 is different from those for the first ILD layer 308 and the third ILD layer 318. In one embodiment, the second ILD layer 316 includes silicon nitride (SiN), silicon oxynitride (SiON) or silicon carbide (SiC). The third ILD layer 318 can contain one or more than one dielectric layers, in which the material thereof can be the same or different from that of the first ILD layer 308, such as $SiO_2$, tetraethyl orthosilicate (TEOS) or plasma enhanced etraethyl orthosilicate (PETEOS), but is not limited thereto. The method for forming the first ILD layer 308, the second ILD layer 316 and the third ILD layer 318 can include a chemical vapor deposition (CVD) process, a spin coating process, or other suitable process that can form any dielectric materials.

Figure 6:
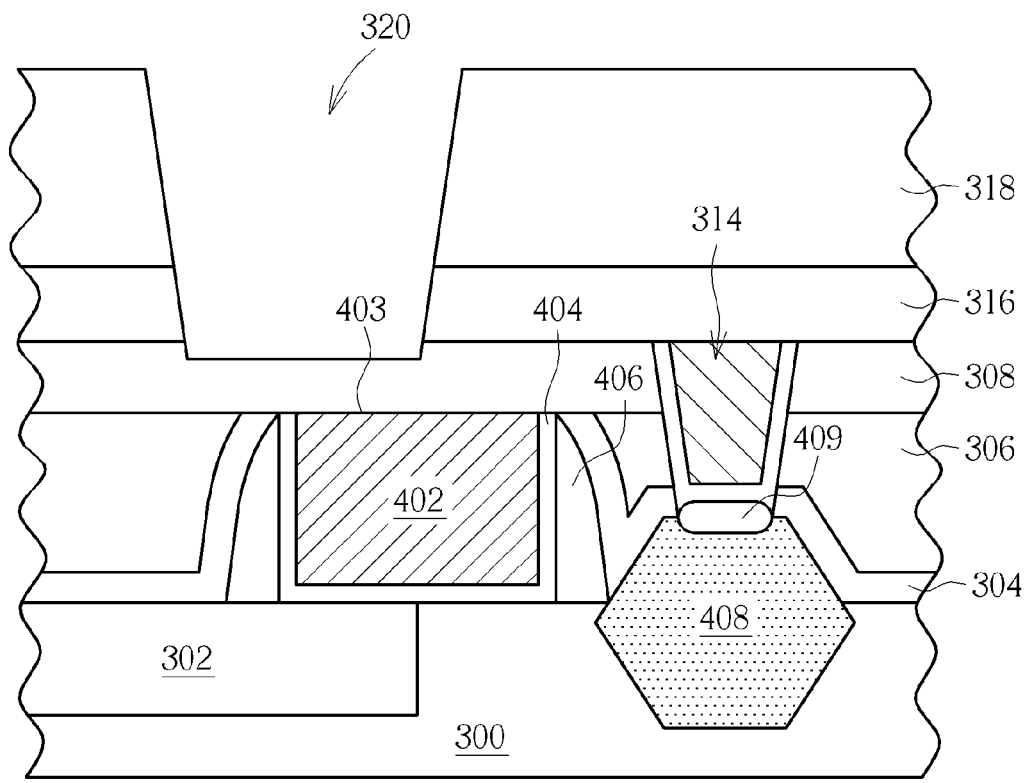

As shown in FIG. 6, a first opening 320 corresponding above the gate 402 is formed in the third ILD layer 318 and the second ILD layer 316. The step of forming the first opening 320 includes forming a first photoresist layer (not shown) and a first mask layer (not shown) on the third ILD layer 318, and at least one lithography step and an etching process are performed to respectively pattern the first photoresist layer and the first mask layer. The first photoresist layer is then removed and an etching process is carried out to form the first opening 320 by using the patterned mask layer as a mask. Since the second ILD layer 316 has an etching selectivity with respect to the first ILD layer 308, the etching process stops on the first ILD layer 308 and a bottom portion of the first opening 320 is disposed in the first ILD layer 308. However, the gate 402 is not exposed. In one embodiment of the present invention, the first photoresist layer and the first mask layer can have different embodiments depending on the process technology. For example, the first photoresist layer is a photoresist material suitable for light source having a wavelength of 193 nm, and a bottom anti-reflection coating (BARC) can be formed under the photoresist layer. The first mask layer may be one single layer or multi layers, which are made of various kinds of hard mask materials, such as silicon nitride (SiN), silicon oxynitride (SiON), silicon carbide (SiC) or carbon-containing organic material, such as advanced pattern film (APF) supplied by the Applied Materials company. In one preferred embodiment, the mask layer can include a silicon-containing hard-mask bottom anti-reflection coating (SHB) layer and an organic dielectric layer (ODL) layer provided by Shin-Etsu Chemical Co. Ltd., wherein the SHB layer is disposed directly under the photoresist layer to serve as a BARC and a mask layer, and the ODL layer serves as a final mask layer.

As shown in FIG. 7, another lithography and etching step are performed to form a second opening 322 in the third ILD layer 318. The second opening 322 is disposed correspondingly above the first contact plug 314. Preferably, the second opening 322 penetrates through the third ILD layer 318 to expose the second ILD layer 316. However, the first contact plug 314 is not exposed. In one embodiment, the step of forming the second opening 322 includes forming a second photoresist layer (not shown) and a second mask layer (not shown), wherein the embodiments of the second photoresist layer and the second mask layer are similar to those of the first photoresist layer and the first mask layer, and are not described.

As shown in FIG. 8, another etching step are performed to simultaneously deepen the first opening 320 and the second opening 322 until the first opening 320 exposes the gate 402 and the second opening 322 exposes the first contact plug 314. Subsequently, a surface treatment process can be performed optionally. For example, Ar gas, $H_2$ gas or $N_2$ gas is used to treat the surface of the first opening 320 and the second opening 322.

As shown in FIG. 9 and FIG. 10, a second barrier layer 324 and a second metal layer 326 are formed on the substrate 300, wherein the second barrier layer 324 is formed conformally along the surface of the first opening 320 and the second opening 322, and the second metal layer 326 completely fills the first opening 320 and the second opening 322. In one embodiment, the second barrier layer 324 can include Ti, TiN or TaN or a plurality of metal layers such as Ti/TiO, but is not limited thereto. The second metal layer 326 can include a variety of low-resistance metal materials, such as aluminum (Al), titanium (Ti), tantalum (Ta), tungsten (W), niobium (Nb), molybdenum (Mo), copper (Cu) or the like, so as to reduce the resistance for the gate 402 or the first contact plug 314. Subsequently, a planarization process is performed to remove the second barrier layer 324 and the second metal layer 326 outside the first opening 320 and the second opening 322. Consequently, as shown in FIG. 9, the second barrier layer 324 and the second metal layer 326 in the first opening 320 become a first metal connect 328, and the second metal layer 326 in the second opening 322 become a second metal connect 330.

In another embodiment, the first opening 320 and the second opening 322 can be filled into different barrier layer and metal layer. For example, a sacrifice layer can be filled into the second opening 322. A second barrier layer and a second metal layer can be then filled into the first opening 320. Next, the sacrifice layer in the second opening 322 is removed and another sacrifice layer is formed on the first opening 320. Subsequently, a third metal layer and a third barrier layer is formed in the second opening 322. A planarization process is performed lastly. In this manner, the first contact plug 314, the first metal connect 328 and the second metal connect 330 can have different metal layers filled therein. In one embodiment, the first contact plug 314 and the first metal connect 328 can include W, and the second metal connect 330 can include Cu. In another embodiment, the first contact plug 314 can include W, and the first metal connect 328 and the second metal connect 330 can include copper.

In the following steps, a metal interconnect system (not shown), which includes a plurality of inter-metal dielectric (IMD) layers and a plurality of metal layers (so called metal 1, metal 2, and the like), can be further formed above the third ILD layer 318 by a conventional metal interconnection fabrication method. The metal interconnection system electrically connects the gate 402 of the transistor 400 by the second metal connect 330 and electrically connects the source/drain region 408 of the transistor 400 by the first contact 314 and the first metal connect 328, thereby providing a signal input/output pathway for the transistor 400.

It is one feature of the present invention that when performing the planarization process to form the first contact plug 314 in FIG. 4, the top surface 403 of the gate 402 is not exposed and is still covered by the first ILD layer 308 having a thickness T. In conventional arts, the planarization process is usually performed to expose the gate to make the top surface 403 of the gate 402 level with the top surface of the first contact plug 314, so it may cause a lot of damage to the gate. Furthermore, it is also a challenge to the slurry selectivity since the gate, the gate dielectric layer and the first contact plug are polished simultaneously in the planarization process. As a result, by using the method provided by the present invention, the drawbacks in the conventional arts can be avoided. In addition, when forming the second metal connect 330 to contact the first contact plug 314 in FIG. 9, since there is still a height T (the thickness T of the first ILD layer 308) between the bottom of the second metal connect 330 and the top surface 403 of the gate 402, the short phenomenon between the second metal connect 330 and the gate 402 can be avoided and the process window of the manufacturing processes can be upgraded.

Another feature of the present invention is that, two different lithography and etching steps are performed to respectively form the first opening 320 and the second opening 322. Because a top portion of the first contact plug 314 is higher than the top surface 403 of the gate 402 by a height T as shown in FIG. 7, when forming the first opening 320 and the second opening 322, the bottom of the first opening 320 is in the first ILD layer 308 and the bottom of the second opening 322 is in the second ILD layer 316 and the gate 402 and the first contact plug 314 are not exposed. Preferably, the depth of the first opening 320 is greater than that of the second opening 322. Therefore, when performing the etching step as shown in FIG. 8, the first contact plug 314 and the gate 402 can be exposed simultaneously, and the quality of the first contact plug 314 and the gate 402 can be kept.

It is noted that, the forming sequence of the first opening 320 and the second opening 322 can be altered. For example, the second opening 322 can be formed and then the first opening 320 is formed. However, before performing another etching process to deepen the first opening 320 and the second opening 322, the gate 402 and the first contact plug 314 are not exposed. Besides, in the above-mentioned embodiment, before exposing the first contact plug 314 and the gate 402, the bottom of the first opening 320 is in the first ILD layer 308 and the bottom of the second opening 322 is in the second ILD layer 316.

Further, it is understood that the first metal connection 328 and the second metal connect 330 in the present invention can be any types of metallic structure used in conventional metal interconnection system, such as a word line, a bit line or a contact plug. As shown in FIG. 10, the first metal connect 328 is a contact plug, and the second metal connect 330 includes a metallic structure filled into a trench, but the structures thereof are not limited to the above embodiments.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure having at least a metal connect, comprising:
   providing a substrate;
   forming a transistor on the substrate and a first inter-dielectric (ILD) layer on the transistor, wherein the transistor comprises a gate and a source/drain region;
   forming a contact plug in the first ILD layer to electrically connect the source/drain region, wherein a top surface of the first contact plug is higher than a top surface of the gate, and the top surface of the gate is level with a bottom surface of the first ILD layer;
   forming a second ILD layer on the first ILD layer and forming a third ILD layer on the second ILD layer, wherein etching rates of the first ILD layer and the second ILD layer are different from each other by using a same etchant;
   forming a first opening correspondingly above the gate and a second opening correspondingly above the first contact plug in the third ILD layer, wherein a depth of the first opening is greater than that of the second opening;
   deepening the first opening and the second opening such that the gate is exposed by the first opening and the first contact plug is exposed by the second opening, wherein the bottom of the first opening and the bottom of the second opening are in different layers before the deepening process; and
   filling a metal layer in the first opening and the second opening to form a first metal connect and a second metal connect respectively.

2. The method for forming the semiconductor structure having at least a metal connect as in claim 1, comprising a first lithography and etching process to form the first opening and a second lithography and etching process to form the second opening.

3. The method for forming the semiconductor structure having at least a metal connect as in claim 1, wherein before the deepening process, the bottom of the first opening is in the first ILD layer and the bottom of the second opening is in the second ILD layer.

4. The method for forming the semiconductor structure having at least a metal connect as in claim 1, wherein before the deepening process, the bottom of the first opening is in the second ILD layer and the bottom of the second opening is in the third ILD layer.

5. The method for forming the semiconductor structure having at least a metal connect as in claim 1, wherein the first ILD layer has an etching selectively with respect to the second ILD layer.

6. The method for forming the semiconductor structure having at least a metal connect as in claim 1, wherein the second ILD layer has an etching selectively with respect to the third ILD layer.

7. The method for forming the semiconductor structure having at least a metal connect as in claim 1, wherein forming the first opening and then forming the second opening.

8. The method for forming the semiconductor structure having at least a metal connect as in claim 1, wherein forming the second opening and then forming the first opening.

9. The method for forming the semiconductor structure having at least a metal connect as in claim 1, wherein the step of forming the first opening and the second opening comprises using a mask layer and a photoresist layer.

10. The method for forming the semiconductor structure having at least a metal connect as in claim 9, wherein the mask layer and the photoresist layer has a tri-layered structure.

11. The method for forming the semiconductor structure having at least a metal connect as in claim 10, wherein the tri-layered structure includes photoresist/SHB layer/ODL layer.

12. The method for forming the semiconductor structure having at least a metal connect as in claim 9, wherein the mask layer includes silicon-containing organic material.

13. The method for forming the semiconductor structure having at least a metal connect as in claim 9, wherein the mask layer includes SiN, SiON or SiC.

14. The method for forming the semiconductor structure having at least a metal connect as in claim 1, wherein the step of forming the first contact plug comprises a planarization process and after the planarization process, a first ILD layer having a predetermined thickness is disposed on the top surface of the gate.

15. The method for forming the semiconductor structure having at least a metal connect as in claim 14, wherein the predetermined thickness is greater than 100 angstroms.

* * * * *